(12) United States Patent
Hsieh et al.

(10) Patent No.: US 6,858,354 B1
(45) Date of Patent: Feb. 22, 2005

(54) METHOD TO PREVENT SIDE LOBE ON SEAL RING

(75) Inventors: Hung-Chang Hsieh, Hsin-Chu (TW); Chang-Cheng Hung, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 93 days.

(21) Appl. No.: 10/255,482

(22) Filed: Sep. 26, 2002

(51) Int. Cl.[7] ................................................. G03F 9/00
(52) U.S. Cl. .......................... 430/5; 430/322; 430/323; 716/19; 716/21
(58) Field of Search ........................... 430/5, 322, 323; 716/19, 21

(56) References Cited

U.S. PATENT DOCUMENTS

| | | | |
|---|---|---|---|
| 5,795,682 A | 8/1998 | Garza | 430/5 |
| 6,210,841 B1 | 4/2001 | Lin et al. | 430/5 |
| 6,291,113 B1 | 9/2001 | Spence | 430/5 |
| 6,355,503 B2 | 3/2002 | Schroeder | 438/116 |
| 6,413,684 B1 * | 7/2002 | Stanton | 430/5 |
| 6,630,408 B1 * | 10/2003 | Tzu et al. | 438/717 |
| 2001/0038952 A1 * | 11/2001 | Kim et al. | 430/5 |

* cited by examiner

*Primary Examiner*—John S. Chu
(74) *Attorney, Agent, or Firm*—Thomas, Kayden, Horstemeyer & Risley

(57) ABSTRACT

A new method is provided for the creation of a seal ring or fuse ring over the surface of a Phase Shift Mask. A seal ring pattern is created over the surface of a phase shift mask through a layer of phase shift material and a layer of opaque material. The seal ring is surrounded by a layer of opaque material by etching the layer of opaque material.

39 Claims, 3 Drawing Sheets

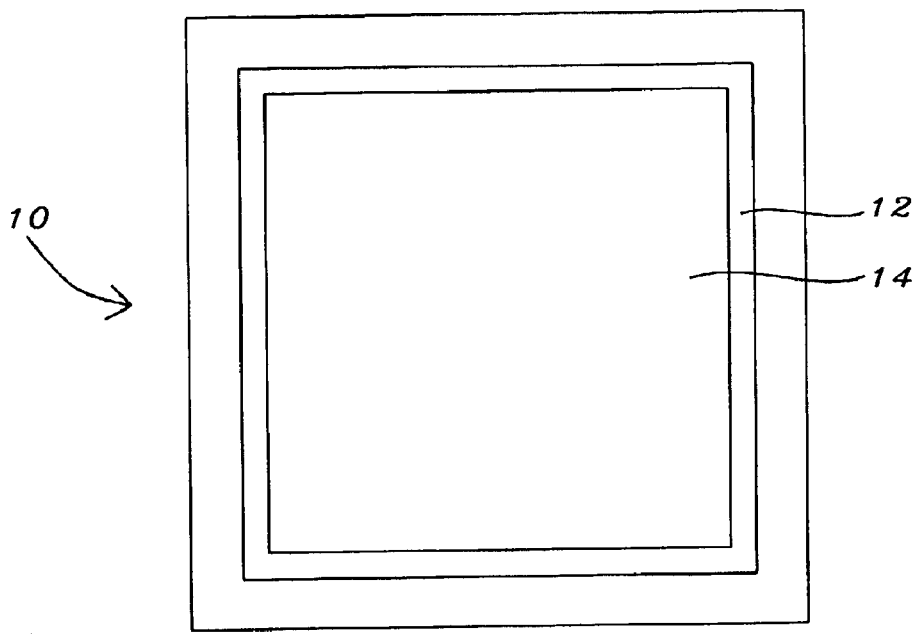
FIG. 1 – Prior Art
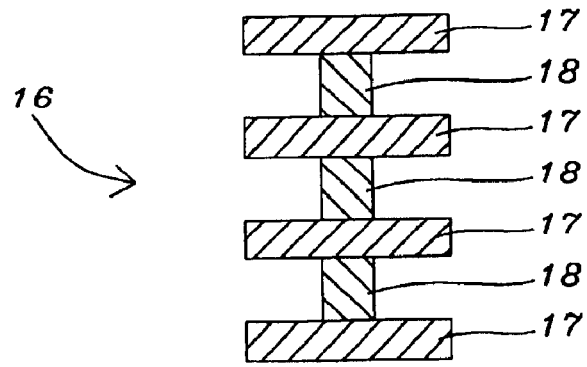
FIG. 2 – Prior Art
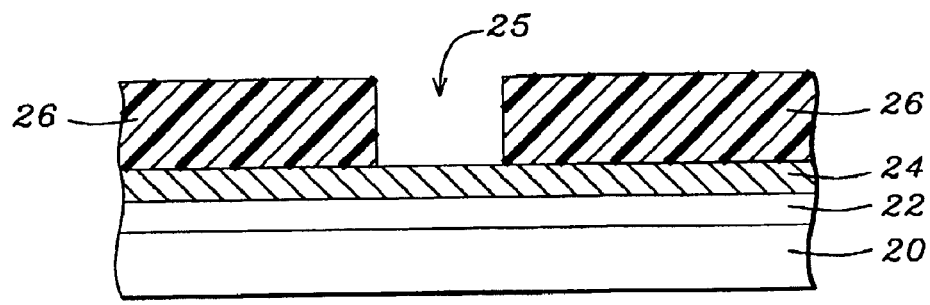
FIG. 3

METHOD TO PREVENT SIDE LOBE ON SEAL RING

BACKGROUND OF THE INVENTION

(1) Field of the Invention

The invention relates to the fabrication of integrated circuit devices, and more particularly, to a method for using a seal ring for a Phase Shift Mask in such a manner that no side lobe ringing problems occur.

(2) Description of the Prior Art

A photolithographic mask provides the ability to selectively expose the surface of a layer of light sensitive material for the creation of semiconductor patterns therein. The photolithographic mask contains a pattern of device features that are transposed from the mask to underlying layers of photosensitive semiconductor material such as a layer of photoresist. A standard photo mask contains a transparent substrate, typically made of quartz. A patterned layer of opaque material is created over a surface of the transparent substrate. Chromium is typically used for the opaque material, deposited to a thickness of about 1,000 Angstrom. Alternate opaque materials for the creation of the patterned layer over the surface of a photolithographic mask are nickel and aluminum.

The principle of phase shifting of the light as the light passes through the mask is widely applied in the creation of photolithographic masks. Phase shifting masks are used to create device features of sub-micron dimensions. It is well known in the art that adjacent light beams, which are in extreme close proximity to each other while the light beams are used to create sub-micron devices features, mutually influence each other, having a detrimental effect on the definition of the exposed patter. The phase shift mask counteracts this mutual influence that closely spaced light beams have on each other. As a further advance, alternate phase shifting masks are used, where the phase shifting characteristic of the phase shifting mask is alternately counteracted in the light as the light passes through the photo mask.

In the creation of photolithographic mask difficulties are encountered by the transition or boundaries between light transmitting and light blocking surface areas of the mask. Light that passes close to these boundaries is diffracted, resulting in loss of sharpness of definition of the exposed and therefrom created pattern. Ideally, the exposing light passes through the transparent surface of the mask in an equal amount of energy, even where the boundary of the transparent surface of the mask is approached. The opposite is ideally true of the opaque surface area of the mask: the light should ideally be completely blocked from passing through the surface area of the mask that is covered with opaque material, also independent of the boundary of the opaque surface area being approached. In actual implementation however light will be diffracted due to the existence of the boundary between the transparent and the opaque surface areas of the mask, a defraction that reduces definition of the created pattern. Light defraction that occurs at boundaries between transparent and opaque surface areas of a photo-lithographic mask is generally referred to as side lobe ringing of the transmitted light.

To compensate for effects of light defraction, methods have been provided for the compensation thereof by for instance, U.S. Pat. No. 5,795,682 (Garza), the creation of guard rings which provide compensating light transmissive regions that are located such that side lobe ringing is most effectively counteracted. These compensating light transmissive regions do not contribute to the definition of a pattern in the exposed surface. The effectiveness of the compensating transmissive regions is assured due to the fact that the radiation that causes the side lobe ringing is about 180 degrees out of phase with the radiation that passes through the transmissive regions.

The invention does not address the creation of guard rings as these guard rings have been provided by U.S. Pat. No. 5,795,682 (Garza). In the creation of a PSM, a seal ring image is provided over the surface of the mask. This seal ring image is projected onto the exposed surface, surrounding the active surface area of the exposed chip for the protection of the chip during the process of sawing or singulating the chip. This seal ring provided in or over the surface of the chip is typically a relatively wide line of metal, comprising overlaying layers of metal-1 through metal-n, that are interconnected with vias. This seal ring serves as a barrier and provides protection against mostly moisture penetration into the chip.

The instant invention addresses the creation of the seal ring image, also referred to as a fuse guard ring, over the surface of the photolithographic mask.

U.S. Pat. No. 5,795,682 (Garza) shows a guard ring to compensate for sidelobe ringing in an APSM.

U.S. Pat. No. 6,355,503 B2 (Schroeder) shows square contact holes utilizing a sidelobe formation.

U.S. Pat. No. 6,291,113 B1 (Spence) shows a side lobe suppressing PSM.

U.S. Pat. No. 6,210,841 B1 (Lin et al.) is a related APSM patent.

SUMMARY OF THE INVENTION

A principle objective of the invention is to provide a Phase Shift Mask wherein sidelobe occurrence associated with the seal ring or fuse guard ring are reduced.

In accordance with the objectives of the invention a new method is provided for the creation of a seal ring or fuse ring over the surface of a Phase Shift Mask. A seal ring pattern is created over the surface of a phase shift mask through a layer of phase shift material and a layer of opaque material. The seal ring is surrounded by a layer of opaque material by etching the layer of opaque material.

BRIEF DESCRIPTION OF THE DRAWINGS

FIG. 1 shows a top view of a conventional photolithographic exposure mask, highlighting the seal ring thereof.

FIG. 2 shows a cross section of the seal ring that is created around a perimeter of a semiconductor chip.

FIGS. 3 through 6 address the invention, as follows:

FIG. 3 shows the cross section of a quartz surface over which have been deposited a layer of phase shifting material and a layer of opaque material, a first photoresist mask has been created.

FIG. 4 shows a cross section of the quartz surface after the layers of opaque material and phase shift material have been etched in accordance with the first photoresist mask, the first photoresist mask has been removed.

FIG. 5 shows the creation of a second photoresist mask.

FIG. 6 shows a cross section after the layer of opaque material ahs been etched in accordance with the second photoresist mask.

DESCRIPTION OF THE PREFERRED EMBODIMENTS

Figure 4:
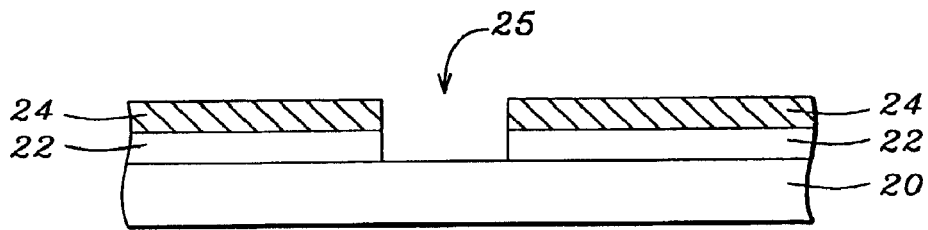

For half-tone shift masks the shift material is typically MoSiON. The standard mask comprises a transparent substrate on the surface of which a patterned layer of opaque material has been created. Typically used for the opaque material is chromium that has been deposited over the quartz substrate to a thickness of about 1,000 Angstrom. Alternate opaque materials for the creation of the patterned layer on the surface of a photolithographic mask are nickel and aluminum while for more sophisticated masks such as halftone phase shift masks MoSiON is used as the phase shift material. For the substrate most typically is used quartz whereby however glass and sapphire can also be used for this purpose.

The cross section that is shown in FIG. 1 is a top view of a photolithographic exposure mask 10 wherein specifically are highlighted the seal ring exposure area 12 that surrounds the surface area of the mask in which conventional patterns are created.

It has previously been indicated that created semiconductor devices are protected against outside influences by a seal or fuse guard ring, the cross section of such a seal ring is shown in FIG. 2 wherein are highlighted the seal ring as comprising overlying layers 17 of seal ring metal that are interconnected by overlying and therewith aligned vias 18. It is the creation of this seal ring or fuse guard ring that is addressed by the invention.

The invention is now described in detail using FIG. 3 through 6 for this purpose.

Shows in the cross section of FIG. 3 is a transparent surface 20, typically comprising quartz, over the surface of which have been deposited a layer 22 of phase shift material such as MoSiON and a layer 24 of opaque material, such as chrome. A first photoresist mask 26 has been created over the surface of the layer 24 of chrome, using conventional methods of photolithographic exposure and development. Resist mask 26 preferably comprises E-beam resist and defines the seal ring or fuse guard pattern. The pattern 25 that is created through the first photoresist mask is the pattern of the seal ring 12, FIG. 1. The cross-sections that are shown in FIGS. 3–6 are therefore cross-section that are limited to the perimeter of an exposure mask.

The layers 24 of chrome and 22 of MoSiON are etched in accordance with the first photoresist pattern 26, the results of which are shown in the cross section of FIG. 4. The first photoresist pattern 26 has been removed from the surface of layer 24 using conventional methods of resist ashing followed by a thorough surface clean.

Typical processing conditions for the application of an isotropic etch, applied to the surface of layer 221 of MoSiON, are using a pressure of about 150 mTorr, using $CF_4$ and $O_2$ as etchants at a flow ratio of 100:10 (100 sccm $CF_4$ and 10 sccm $O_2$) and an applied power of about 200 watts.

Figure 5:
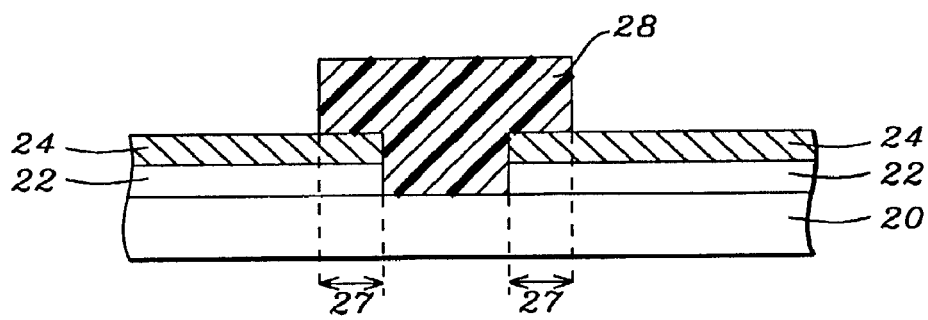

A second photoresist pattern 28 is now created, as shown in the cross section of FIG. 5, whereby the second resist pattern 28 overlies the surface of layer 24 of chrome over a distance 27 that extends to both sides of the openings 25 created through layers 24 and 22.

Using the second photoresist pattern 28 as a mask, the layer 24 of chrome is etched, leaving in place a patterned and etched layer of chrome that surrounds the seal ring or guard ring opening 25. It is this patterned and etched layer 28 of chrome that is shown in cross section in FIG. 6 which serves as sidelobe inhibitor during the process of creating the seal ring or the guard ring of the semiconductor device.

Figure 7:
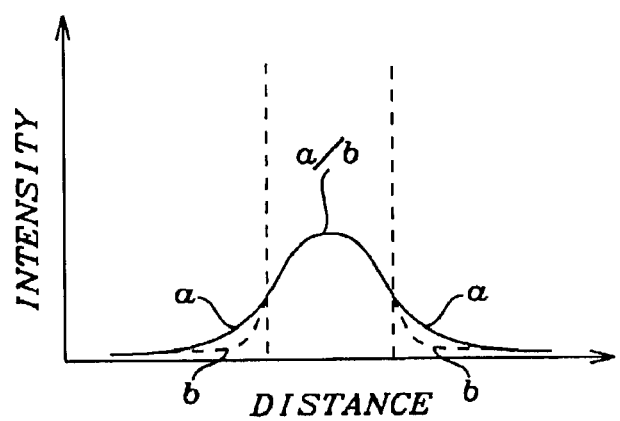
FIGS. 7 and 8 show the side lobe suppression as achieved by the invention.
Figure 8:
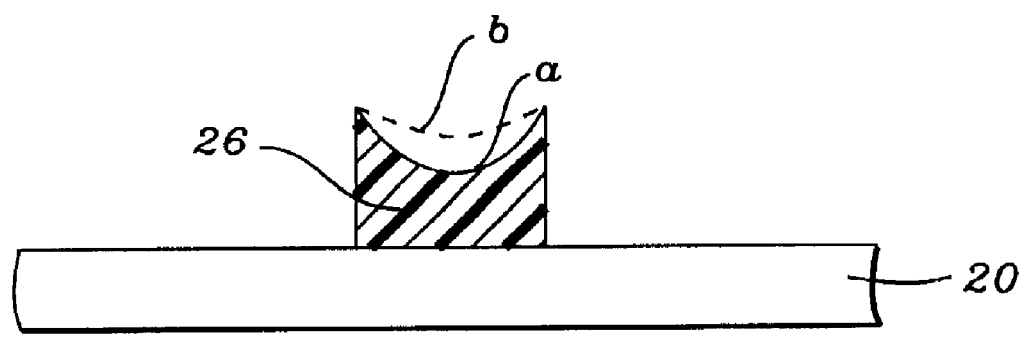

This latter effect is further highlighted in FIGS. 7 and 8, whereby the intensity of the light that is transmitted through the exposure mask is plotted along a vertical axis as a function of distance. At the center of opening 25, the exposure is of a maximum value from which the exposure intensity decreases as the perimeter of opening 25 is approached. This is shown in the graph of FIG. 7 using curve "a". Curve "b" in the same graph shows the effect of the layer 24 of chrome since this layer comprises an opaque material and therefore affects a reduction in light transmission.

The results that follow from the modified intensity pattern of the light that is transmitted through the exposure mask are shown in the cross sections of an exposed layer 26 of photoresist. The profile "a" of the exposed layer of photoresist corresponds to curve "a" in FIG. 7 and therefore shown a relatively severe dip in the exposure density, resulting in a photoresist removal profile that follows profile "a" of FIG. 8.

The profile "b" of the exposed layer of photoresist corresponds to curve "b" in FIG. 7 and therefore shows a sharply reduced severe dip in the exposure density, resulting in a photoresist removal profile that follows profile "b" of FIG. 8.

Figure 6:
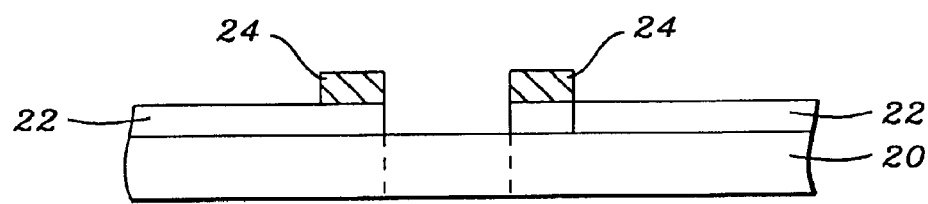

By comparing the two photoresist removal profiles "a" and "b", it is clear that the patterned and etched layer 24, FIG. 6, of chrome results in a photoresist removal profile that more closely resembles an ideal profile, which ideally should resemble a square or rectangle.

To summarize the invention:
1. The invention provides a "forbidden zone", the patterned and etched layer 24, FIG. 6, of chrome overlaying the layer of phase shift material, this "forbidden zone" provides sidelobe prevention in creating a seal ring or guard ring over the surface of a semiconductor chip
2. The patterned and etched layer 24, FIG. 6, of chrome remains in place adjacent to the profile of the seal ring and the guard ring
3. The invention requires two photoresist masks for the creation of the sidelobe prevention
4. The dimension of the sidelobe prevention, that is dimension 27, FIG. 5, is preferred to be in the range between 0.1 and 200 $\mu$m.

The creation of the vias 18, FIG. 2, that are conventionally part of a seal ring, is not part of the invention.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of preventing side lobes in creating a guard ring pattern over the surface of a phase shift mask, comprising steps of:

providing a phase shift mask substrate;

creating a seal ring pattern of exposure through a first layer of phase shift material and a second layer of opaque material over the surface of said phase shift mask substrate; and surrounding said seal ring pattern of exposure with an opaque forbidden zone.

2. The method of claim 1, said phase shift mask substrate comprising quartz.

3. The method of claim 1, said creating a seal ring pattern of exposure over the surface of said phase shift mask substrate comprising steps of:

depositing a layer of phase shift material over the surface of said phase shift mask substrate;

depositing a layer of opaque material over the surface of said layer of phase shift material; and patterning and first etching said layer of opaque material and said layer of phase shift material, creating a pattern of a seal ring there through.

4. The method of claim 3, said patterning and first etching said layer of opaque material and said layer of phase shift material comprising creating a first photoresist mask over the surface of said layer of opaque material, said first photoresist mask exposing the surface of said layer of opaque material in a pattern of said seal ring.

5. The method of claim 1, said layer of phase shift material comprising MoSiON.

6. The method of claim 1, said layer of opaque material comprising chrome.

7. The method of claim 1, said surrounding said seal ring pattern of exposure with an opaque forbidden zone comprising steps of second etching said layer of opaque material, leaving said layer of opaque material in place over a distance over the surface of said layer of phase shift material and adjacent to said seal ring pattern.

8. The method of claim 7, said second etching said second layer of opaque material comprising creating a second photoresist mask over the surface of said layer of opaque material, said second photoresist mask covering the surface of said layer of opaque material over a distance adjacent to said seal ring pattern, said second photoresist mask further filling said seal ring pattern.

9. The method of claim 1, said forbidden zone having a cross section of between about 0.1 and 100 $\mu$m as measured in a perpendicular direction from said seal ring pattern.

10. A method of preventing side lobes in creating a guard ring pattern over the surface of a phase shift mask, comprising steps of:

providing a phase shift mask substrate, said phase shift mask substrate having been provided over the surface thereof with a seal ring pattern of exposure through a first layer of phase shift material and a second layer of opaque; and surrounding said seal ring pattern of exposure with an opaque forbidden zone.

11. The method of claim 10, said phase shift mask substrate comprising quartz.

12. The method of claim 10, seal ring pattern of exposure having been created over the surface of said phase shift mask substrate by:

depositing a layer of phase shift material over the surface of said phase shift mask substrate;

depositing a layer of opaque material over the surface of said layer of phase shift material; and patterning and first etching said layer of opaque material and said layer of phase shift material, creating a pattern of a seal ring there through.

13. The method of claim 12, said patterning and first etching said layer of opaque material and said layer of phase shift material comprising creating a first photoresist mask over the surface of said layer of opaque material, said first photoresist mask exposing the surface of said layer of opaque material in a pattern of said seal ring.

14. The method of claim 10, said layer of phase shift material comprising MoSiON.

15. The method of claim 10, said layer of opaque material comprising chrome.

16. The method of claim 10, said surrounding said seal ring pattern of exposure with an opaque forbidden zone comprising steps of second etching said layer of opaque material, leaving said layer of opaque material in place over a distance over the surface of said layer of phase shift material and adjacent to said seal ring pattern.

17. The method of claim 16, said second etching said second layer of opaque material comprising creating a second photoresist mask over the surface of said layer of opaque material, said second photoresist mask covering the surface of said layer of opaque material over a distance adjacent to said seal ring pattern, said second photoresist mask further filling said seal ring pattern.

18. The method of claim 10, said forbidden zone having a cross section of between about 0.1 and 100 $\mu$m as measured in a perpendicular direction from said seal ring pattern.

19. A method of creating a guard ring pattern over the surface of a phase shift mask, comprising steps of:

providing a substrate for a phase shift mask;

depositing a layer of phase shift material over the surface of said substrate;

depositing a layer of opaque material over the surface of said layer of phase shift material;

first patterning and etching said layer of opaque material and said layer of phase shift material, creating a pattern of a seal ring there-through;

second etching said layer of opaque material, thereby surrounding said seal ring pattern with an opaque forbidden zone.

20. The method of claim 19, said substrate for a phase shift mask comprising quartz.

21. The method of claim 19, said layer of phase shift material comprising MoSiON.

22. The method of claim 19, said layer of opaque material comprising chrome.

23. The method of claim 19, said first patterning and etching said layer of opaque material and said layer of phase shift material comprising creating a first photoresist mask over the surface of said layer of opaque material, said first photoresist mask exposing the surface of said layer of opaque material in a pattern of said seal ring.

24. The method of claim 19, said second etching said layer of opaque material comprising creating a second photoresist mask over the surface of said layer of opaque material, said second photoresist mask covering the surface of said layer of opaque material over a distance adjacent to said seal ring pattern, said second photoresist mask further filling said seal ring pattern.

25. The method of claim 19, said surrounding said seal ring pattern with an opaque forbidden zone comprising leaving said layer of opaque material in place over a distance over the surface of said layer of phase shift material and adjacent to said seal ring pattern.

26. The method of claim 19, said opaque forbidden zone having a cross section of between about 0.1 and 100 $\mu$m as measured in a perpendicular direction from said seal ring pattern.

27. A method of preventing side lobes in creating a guard ring pattern over the surface of a phase shift mask, comprising steps of:

providing a phase shift mask substrate;

creating a seal ring pattern of exposure through a first layer of phase shift material and a second layer of opaque material over the surface of said phase shift mask substrate; and surrounding said seal ring pattern of exposure with an opaque forbidden zone having a cross section of between about 0.1 and 100 µm as measured in a perpendicular direction from said seal ring pattern by etching said second layer of opaque material.

28. The method of claim 27, said phase shift mask substrate comprising quartz.

29. The method of claim 27, said creating a seal ring pattern of exposure over the surface of said phase shift mask substrate comprising steps of:

depositing a layer of phase shift material over the surface of said phase shift mask substrate;

depositing a layer of opaque material over the surface of said layer of phase shift material; and patterning and first etching said layer of opaque material and said layer of phase shift material, creating a pattern of a seal ring there through.

30. The method of claim 29, said patterning and first etching said layer of opaque material and said layer of phase shift material comprising creating a first photoresist mask over the surface of said layer of opaque material, said first photoresist mask exposing the surface of said layer of opaque material in a pattern of said seal ring.

31. The method of claim 27, said layer of phase shift material comprising MoSiON.

32. The method of claim 27, said layer of opaque material comprising chrome.

33. The method of claim 27, said etching said second layer of opaque material comprising steps of second etching said layer of opaque material, leaving said layer of opaque material in place over a distance over the surface of said layer of phase shift material and adjacent to said seal ring pattern.

34. The method of claim 33, said second etching said second layer of opaque material comprising creating a second photoresist mask over the surface of said layer of opaque material, said second photoresist mask covering the surface of said layer of opaque material over a distance adjacent to said seal ring pattern, said second photoresist mask further filling said seal ring pattern.

35. A guard ring pattern over the surface of a phase shift mask, comprising:

a phase shift mask substrate;

a seal ring pattern of exposure created through a first layer of phase shift material and a second layer of opaque material over the surface of said phase shift mask substrate; and an opaque forbidden zone, comprising said second layer of opaque material, surrounding said seal ring pattern of exposure and overlying said first layer of phase shift material.

36. The guard ring pattern of claim 35, said opaque forbidden zone having a cross section of between about 0.1 and 100 µm as measured in a perpendicular direction from said seal ring pattern.

37. The guard ring pattern of claim 35, said phase shift mask substrate comprising quartz.

38. The guard ring pattern of claim 35, said layer of phase shift material comprising MoSiON.

39. The guard ring pattern of claim 35, said layer of opaque material comprising chrome.

* * * * *